United States Patent
Sim

(10) Patent No.: US 7,236,591 B2
(45) Date of Patent: Jun. 26, 2007

(54) METHOD FOR PERFORMING TURBO DECODING IN MOBILE COMMUNICATION SYSTEM

(75) Inventor: Myung Sub Sim, Seoul (KR)

(73) Assignee: LG Electronics Inc., Seoul (KR)

( * ) Notice: Subject to any disclaimer, the term of this patent is extended or adjusted under 35 U.S.C. 154(b) by 823 days.

(21) Appl. No.: 09/977,251

(22) Filed: Oct. 16, 2001

(65) Prior Publication Data
US 2002/0056045 A1 May 9, 2002

(30) Foreign Application Priority Data
Oct. 16, 2000 (KR) .............................. 2000-60747

(51) Int. Cl.
*H04L 9/00* (2006.01)
(52) U.S. Cl. ........................................................ 380/33
(58) Field of Classification Search ............ 380/267, 380/268, 33; 714/792, 791; 713/193
See application file for complete search history.

(56) References Cited

U.S. PATENT DOCUMENTS

| 5,446,747 A | 8/1995 | Berrou |
| 6,182,261 B1 | 1/2001 | Haller et al. |
| 6,192,501 B1 * | 2/2001 | Hladik et al. ................ 714/786 |
| 6,304,996 B1 * | 10/2001 | Van Stralen et al. ......... 714/796 |
| 6,392,572 B1 * | 5/2002 | Shiu et al. ..................... 341/81 |
| 6,473,848 B2 * | 10/2002 | Bouraoui et al. ........... 711/206 |

FOREIGN PATENT DOCUMENTS

| EP | 1 160 988 A1 | 12/2001 |
| WO | WO 00/41324 | 7/2000 |
| WO | WO 00/52834 | 9/2000 |

OTHER PUBLICATIONS

"Near Shannon Limit Error—Correcting Coding and Decoding: Turbo Codes", IEEE 1993, Berrou et al.*

* cited by examiner

*Primary Examiner*—Gilberto Barron
*Assistant Examiner*—Thomas Ho
(74) *Attorney, Agent, or Firm*—Ked & Associates

(57) ABSTRACT

A method for performing turbo decoding in an advanced mobile communication system is disclosed, in which an interleaving operation, a maximum a posteriori (MAP) decoding operation, and a deinterleaving operation are implemented simultaneously. Signals stored in a specific address space of a memory are decoded in a predetermined order and, at the same time, each decoded signal is stored in the same specific address space previously used to store the signals prior to decoding. Accordingly, the turbo decoding time can be reduced by half and the size of the memory for storing extrinsic information can also be reduced by half.

12 Claims, 2 Drawing Sheets

US 7,236,591 B2

METHOD FOR PERFORMING TURBO DECODING IN MOBILE COMMUNICATION SYSTEM

BACKGROUND OF THE INVENTION

1. Field of the Invention

The present invention relates to a method for processing data in a communication system and, more particularly, to a method for performing turbo decoding in a mobile communication system.

2. Background of the Related Art

As known in the related art, a turbo code generator includes two or more recursive systematic convolutional (RSC) encoders arranged in parallel through an interleaver. Turbo codes generated through the turbo code generator are used to transmit data at high transmission rate in the standard for an advanced mobile communication system.

The turbo codes are processed for generating bit rows in a block unit. Particularly, in the case where large sized data bit rows are encoded, the turbo codes have excellent coding gain to convolutional codes. The turbo codes are iteratively decoded on codes of a simple component in a receiving system, so that the receiving system has excellent error correction capability.

Recently, a method for simply performing turbo decoding and a turbo decoder have been suggested to support data transmission at high speed under the mobile communication environment. According to the turbo decoder, input code words pass through two convolutional decoders in turn. Therefore, the turbo decoder has a simplified structure.

However, in order that the input code words iteratively pass through two convolutional decoders, the two convolutional decoders should have output values corresponding to soft decision values having a probability rate of "0" or "1," not hard decision values such as "0" or "1." To obtain such soft decision values, a Maximum A Posteriori (MAP) decoding method has been suggested, in which a posteriori probability value of a data bit is calculated and the data bit is decoded to obtain the maximum posteriori probability value.

FIG. 1 illustrates a structure of a related art turbo decoder. The related art turbo decoder includes a first MAP decoder $D_1$ 101 and a second MAP decoder $D_2$ 103 corresponding to each RSC encoder of an encoder. The turbo decoder further includes an interleaver 102 that serves to perform the same function as that of an interleaver of the encoder, first and second deinterleavers 104 and 105 having an inverse function to that of the interleaver 102, and first to third delay circuits 107 to 109 for delaying signal processing while the first MAP decoder 101 and the second MAP decoder 103 perform their respective logic operations.

The operation of the related art turbo decoder will be described. The code words input to the turbo decoder are decoded by passing through the two MAP decoders 101 and 103. Particularly, the turbo decoder does not decode the successively input code words at one time but decodes them by passing them through the two MAP decoders. As the iterative number of passes through the two MAP decoders 101 and 103 increases, decoding performance is improved.

As shown in FIG. 1, the first MAP decoder 101 decodes composite signals of systematic symbols $x_k$, parity symbols $y_k$, and extrinsic information $d_k$ having $(N-1)^{th}$ iterative number of times among iterative decoding number of times. The second MAP decoder 103 decodes an output signal of the interleaver 102 and parity symbols $y_k$. An input signal of the interleaver 102 is a composite signal of the output signal from the first MAP decoder 101 and the extrinsic information signal $d_k$, having $(N-1)^{th}$ iterative number of times. The extrinsic information signal is delayed by the first delay circuit 107 for a certain time.

First deinterleaver 104 deinterleaves a composite signal of the output signal of the interleaver, which passed through the second delay circuit 108, and the output signal of the second MAP decoder 103. First deinterleaver 104 outputs the extrinsic information signal $d_k$ having $N^{th}$ iterative number of times. Second deinterleaver 105 deinterleaves a limited signal of the output signal of the second MAP decoder 103 and outputs the deinterleaved signal as a final output bit of the turbo decoder.

FIG. 2 is a diagram illustrating the operation of the related art turbo decoder. Output signals of the first MAP decoder 101 and the second MAP decoder 103 are called extrinsic information. As shown in FIG. 1, the extrinsic information output from the first MAP decoder 101 is interleaved and then used as the input signal of the second MAP decoder 103. The output signal of the second MAP decoder 103 is deinterleaved and then used as the input signal of the first MAP decoder 101.

In other words, once decoding of the first MAP decoder 101 is completed (S10), interleaving is performed on the decoded signal (S11). Once decoding of the second MAP decoder 103 is completed (S12), deinterleaving is performed on the decoded signal (S13). Decoding with the second MAP decoder 103 begins after the completion of the interleaving.

As described above, in the related art turbo decoding, the MAP decoding operation, the interleaving operation, and the deinterleaving operation are sequentially performed. Accordingly, a problem arises in that the decoding time becomes longer. Also, to sequentially perform the above operations, the input and output signals of the interleaver 102 should be stored. To this end, as shown in FIG. 1, a memory 106 that can store two sets of extrinsic information is required. Memory 106 may be used to store the input and output signals of the first and second deinterleavers 104 and 105.

According to the 3GPP WCDMA specification, since the size of the turbo code block is maximum 5114 bit, a memory having a bit capacity of 5114*n*2 is required, wherein n is a positive integer, which is the number of bits of the extrinsic information, and is generally between 4 bits and 8 bits.

The above reference is incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Accordingly, the present invention is directed to a method for performing turbo decoding in an advanced mobile communication system that substantially obviates one or more of the problems due to limitations and disadvantages of the related art.

An object of the present invention is to provide a method for performing turbo decoding in an advanced mobile communication system.

Another object is to provide a method of turbo decoding in which interleaving, MAP decoding, and deinterleaving can simultaneously be performed.

Another object of the present invention is to provide a method for performing turbo decoding in an advanced mobile communication system, in which a memory that stores outputs of two MAP decoders constituting a turbo decoder has a reduced capacity.

To achieve these and other advantages in accordance with the present invention, as embodied and broadly described, an interleaving operation that converts an order of extrinsic information stored in predetermined address regions of a memory, a decoding operation that decodes the interleaved signals, and a deinterleaving operation that deinterleaves the decoded signals and stores the deinterleaved signals in the same address regions of the memory where the previous extrinsic information was stored are implemented simultaneously.

In one aspect of the present invention, a method for performing turbo decoding in a mobile communication system having a memory includes the steps of: primarily decoding signals received from a transmission system and storing the primarily decoded signals in a corresponding address of the memory; outputting the signals stored in the memory by an interleaving operation implemented in such a manner that their order is converted, and secondarily decoding the output signals; and implementing a deinterleaving operation to store the secondarily decoded signals in the same address as that of the primarily decoded signals.

Preferably, the primary decoding and the secondary decoding are iterated for a certain number of times using a Maximum A Posteriori (MAP) algorithm, so as to reduce the receiving error rate.

Preferably, the primary decoding is performed using the signals received from the transmission system and (the certain number of times$-1)^{th}$ signal of the secondarily decoded signals while the secondary decoding is performed using the signals received from the transmission system and the primarily decoded signals.

Preferably, the interleaving operation, the secondarily decoding, and the deinterleaving operation are implemented simultaneously.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Reference will now be made in detail to the preferred embodiments of the present invention, examples of which are illustrated in the accompanying drawings.

A method for performing turbo decoding in an advanced mobile communication system according to the present invention is based on the related art turbo decoder. Accordingly, the method for performing turbo decoding according to the present invention will be described with reference to the turbo decoder of FIG. 1.

Figure 1:
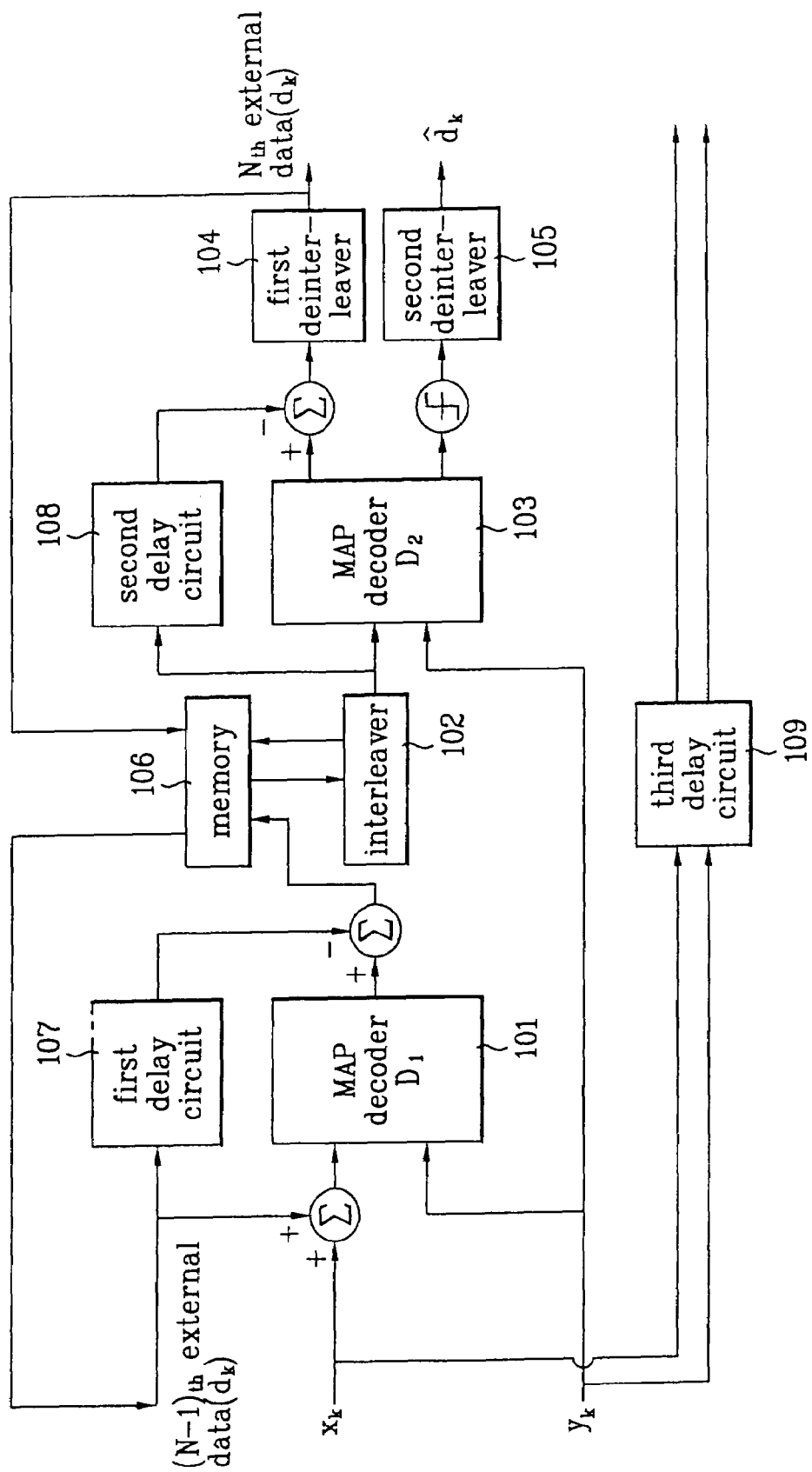
FIG. 1 illustrates a related art turbo decoder.
Figure 2:
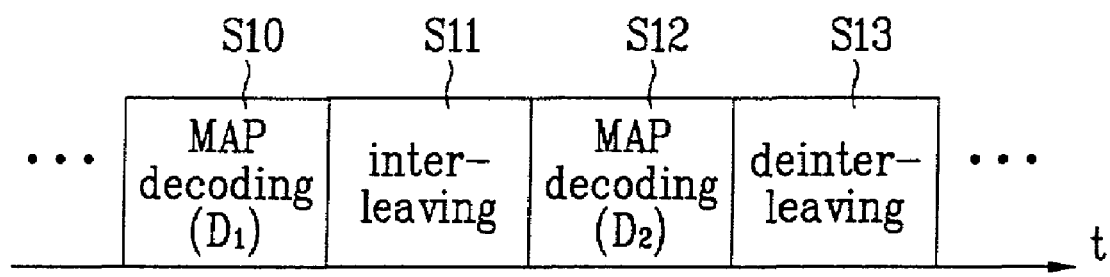
FIG. 2 illustrates a flow of the operation of the related art turbo decoder.

The turbo decoder of FIG. 1 includes a first MAP decoder 101 and a second MAP decoder 103. Output signals from the first and second MAP decoders 101 and 103 are stored in a memory 106. A method for storing the output signals is a main feature of the present invention.

First MAP decoder 101 primarily decodes composite signals of systematic symbols $x_k$, parity symbols $y_k$, and extrinsic information (output signal of the second MAP decoder) having $(N-1)^{th}$ iterative number of times among iterative decoding number of times. Second MAP decoder 103 secondarily decodes an output signal of the interleaver 102 and parity symbols $y_k$ and outputs $N^{th}$ extrinsic information.

Interleaver 102 interleaves signals stored in the memory 106, which are composite signals of the output signal from the first MAP decoder 101 and the $(N-1)^{th}$ extrinsic information delayed by the first delay circuit 107. The second deinterleaver 105 outputs a final output bit of the turbo decoder. Interleaver 102 inputs and outputs signals with the same function as that of an interleaver (not shown) used in a turbo encoder of the transmission system. First deinterleaver 104 and second deinterleaver 105 input and output signals with an inverse function to that of the interleaver used in the turbo encoder of the transmission system.

As described above, one MAP decoder of a general turbo decoder uses the output of the other MAP decoder as extrinsic information and performs MAP decoding on the extrinsic information, the systematic symbols, and the parity symbols.

In addition to the aforementioned turbo decoding, in the present invention, the following turbo decoding method is further provided.

Supposing that an input to output function used in the interleaver of the turbo encoder of the transmission system is $f(k)=a(k)$. The function can be expressed as $x'_k = x_{a(k)}$ or $x'[k]=x[a(k)]$. In this case, the functional relation is valid on the original input applied to the turbo encoder and does not include $x_k$ and $x'_k$ values calculated by the RSC encoder for trellis termination. Therefore, the input to output function of the interleaver 102 used in the turbo decoder also has an input to output relation based on the function "$f(k)=a(k)$."

A set of extrinsic information outputs from a MAP decoder is expressed as $E(k)$ and the interleaving function $a(k)$ is defined by the interleaver 102 of the turbo decoder. In this case, the relation between the interleaving and the deinterleaving can be expressed by the following equations (1) and (2).

Interleaving: $E_1(k)=E(a(k))$ for $k=1, 2, \ldots, s$ (where $s$ is a code block size) (1)

Deinterleaving: $E_d(a(k))=E(k)$ for $k=1, 2, \ldots,$ $s$ (where $s$ is a code block size) (2)

In the equations (1) and (2), $E(k)$ are the outputs of the MAP decoders 101 and 103, which are sequentially generated. That is, the extrinsic information is obtained in the order of $E(1), E(2), \ldots, E(S)$.

For example, supposing that $a(k)=1,3,4,2$ when $k$ is 1,2,3,4, respectively. The outputs $d_{11}, d_{12}, d_{13}, d_{14}$ (sequentially generated) of the first MAP decoder 101 are interleaved and then input to the second MAP decoder 103 as $d_{11}, d_{13}, d_{14}, d_{12}$ in a row. Also, the outputs $d_{21}, d_{22}, d_{23}, d_{24}$ (sequentially generated) of the second MAP decoder 102 are deinterleaved and then input to the first MAP decoder 101 as $d_{21}, d_{24}, d_{22}, d_{23}$ in a row.

The deinterleaving operation can be performed as follows.

After the extrinsic information is calculated and stored in a predetermined region of memory 106, indicated by the a(k), the deinterleaving operation is performed. Consequently, deinterleaving and MAP decoding of the second MAP decoder 103 can be simultaneously performed.

As described above, the deinterleaving operation has an inverse-function relation to the interleaving operation. Accordingly, the order of the signals converted by the interleaving operation should be converted again.

Similarly, the interleaving operation is performed in such a manner that the extrinsic information indicated by a(k) is read out from the memory 106, which stores the output signal of the first MAP decoder 101, and then input to the second MAP decoder 103.

Figure 3:
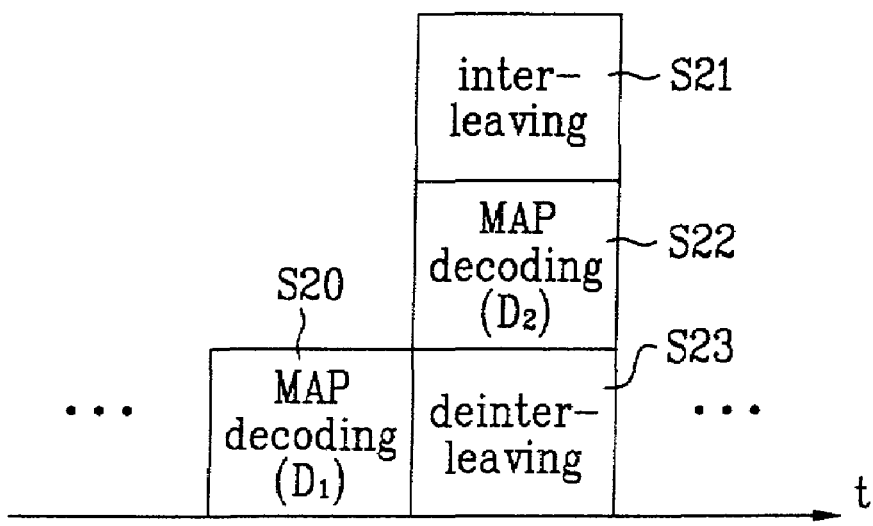
FIG. 3 illustrates a flow of the operation of a turbo decoder according to the present invention.

The turbo decoder of FIG. 1 can be operated, as shown in FIG. 3, using the aforementioned characteristics. The MAP decoding of the first MAP decoder 101 and the second MAP decoder 103 is iterated for a certain number of times prescribed in the mobile communication system. Therefore, the first MAP decoder 101 performs decoding using (the certain number of times−1)$^{th}$ signal output from the second decoder as extrinsic information. Also, the signal output from the second MAP decoder 103 is iterated for a certain number of times and then decoded, so that it is finally output as a decoded bit of the turbo decoder.

FIG. 3 illustrates a flow of the operation of the turbo decoder according to the present invention. The primary MAP decoding is performed on the signal input by the first MAP decoder 101 and the decoded signal is stored in the memory 106 (S20). Interleaving is performed on the output signal of the first MAP decoder 101, stored in the memory 106 (S21). In this case, the interleaving operation cannot be performed until a certain quantity of signal outputs from the first MAP decoder 101, i.e., a set of extrinsic information is stored in the memory 106. Accordingly, it is very difficult to simultaneously perform the primary MAP decoding and the interleaving operation.

Meanwhile, the second MAP decoder 103 uses the memory 106 as follows. Secondary MAP decoding of the second MAP decoder 103 is performed on the value a(k), corresponding to each address among output signals of the interleaver 102 stored in the memory 106 (S22). The secondary MAP decoded value is stored in each address region corresponding to the value a(k) so that the deinterleaving operation is performed (S23).

Therefore, in the present invention, the mobile communication system requires not two sets of memory capacity but a set of memory capacity, so as to store input and output signals of the interleaver. In other words, the present invention requires about half as much memory as the related art method. Consequently, the deinterleaving operation can be performed along with the secondary MAP decoding operation because the data generated from the second MAP decoder 103 are stored in the address region of the memory 106.

Since the interleaving operation cannot be performed until a set of the extrinsic information is stored in memory 106, the interleaving operation cannot be performed together with the first MAP decoding operation of the first MAP decoder 101. For this reason, only the first decoding operation of the first MAP decoder 101 is separately performed and the other operations are performed simultaneously.

The interleaving operation may or may not be performed together with the other operations, depending on the method for implementing a circuit which calculates the interleaving function a(k) of the interleaver located within the turbo encoder and the type of the MAP decoder. Even in a case that the interleaving operation may not be operated together with the other operations, the turbo decoding time can be reduced by ⅓ by performing the second MAP decoding operation and the deinterleaving operation together. Otherwise, the time may be reduced by about one half.

The method for performing turbo decoding according to the present invention has the following advantages. Since the interleaving operation, the second MAP decoding operation of the second MAP decoder, and the deinterleaving operation are performed simultaneously, the turbo decoding time can be reduced by half. Also, the size of the memory for storing the extrinsic information in the mobile communication system can be reduced by half. Accordingly, the delay time is reduced in the whole mobile communication system and the manufacturing cost of the mobile communication system can be saved.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A method for performing turbo decoding, comprising:
   primarily decoding signals received from a transmission system and storing the primarily decoded signals in corresponding addresses of a memory;
   secondarily decoding one of the primarily decoded signals stored in the memory according to a predetermined function, wherein the predetermined function indicates which signal of the primarily decoded signals is to be secondarily decoded;
   storing the secondarily decoded signal in the same address as the address in which the one of the primarily decoded signals was stored; and
   repeating the secondarily decoding and the storing until all of the primarily decoded signals are secondarily decoded.

2. The method of claim 1, wherein the primary decoding and the repeating are iterated n times using a Maximum A Posteriori (MAP) algorithm.

3. The method of claim 2, wherein the primary decoding is performed using a current transmission system signal of the transmission system and an (n−1)$^{th}$ iteration signal of the secondarily decoded signals.

4. The method of claim 1, wherein the secondary decoding is performed using transmission system signals of the transmission system and the primarily decoded signals.

5. A method for performing turbo decoding, comprising:
   primarily decoding signals received from a transmission system and storing the primarily decoded signals in corresponding addresses of a memory;
   secondarily decoding one of the primarily decoded signals stored in the memory according to an equation $E_i(k)=E(a(k))$, wherein k=1, 2, . . . , s (where s is a code block size, E(k) is a MAP decoded signal, and a(k) is an interleaving function defined by an interleaver of a turbo decoder);

storing the secondarily decoded signals in the same address as the address in which the one of the primarily decoded signals is store; and repeating the secondarily decoding and the storing until all of the primarily decoded signals are secondarily decoded.

6. The method of claim 5, wherein the primary decoding and the repeating are iterated n times using a Maximum A Posteriori (MAP) algorithm.

7. The method of claim 6, wherein the primary decoding is performed using a current transmission system signal of the transmission system and an $(n-1)^{th}$ iteration signal of the secondarily decoded signals.

8. The method of claim 5, wherein the secondary decoding is performed using transmission system signals of the transmission system and the primarily decoded signals.

9. A method for performing turbo decoding, comprising:
primarily decoding composite signals comprising systematic symbols $X_k$, $(n-1)^{th}$ iteration extrinsic information, and parity symbols $y_k$;

storing the primarily decoded composite signals in corresponding addresses of a memory;

secondarily decoding one of the primarily decoded composite signals stored in the memory according to a predetermined function to generate one of the nth extrinsic information, wherein the predetermined function indicates which signal of the primarily decoded signals is to be secondarily decoded;

storing the secondarily decoded signals in the same address as the address in which the one of the primarily decoded signals was stored; and repeating the secondarily decoding and the storing until all of the primarily decoded signals are secondarily decoded.

10. The method of claim 9, wherein the primary decoding and the repeating are iterated n times using a Maximum A Posteriori (MAP) algorithm.

11. The method of claim 10, wherein the primary decoding is performed using a current transmission system signal of a transmission system and an $(n-1)^{th}$ iteration signal of the secondarily decoded signals.

12. The method of claim 9, wherein the secondary decoding is performed using the transmission system signals of a transmission system and the primarily decoded signals.

* * * * *